United States Patent [19]

Brown

[11] 4,400,714
[45] Aug. 23, 1983

[54] LEAD FRAME FOR SEMICONDUCTOR CHIP

[75] Inventor: Don B. Brown, Willow Grove, Pa.

[73] Assignee: Jade Corporation, Huntingdon Valley, Pa.

[21] Appl. No.: 204,395

[22] Filed: Nov. 6, 1980

[51] Int. Cl.³ .............................................. H01L 23/48
[52] U.S. Cl. ........................................ 357/70; 357/68
[58] Field of Search .................................... 357/70, 68

[56] References Cited

U.S. PATENT DOCUMENTS 3,971,062 7/1976 Merkle ............................ 357/700 R
4,301,464 11/1981 Otsuki et al. ..................... 357/700 R Primary Examiner—James W. Davie
Assistant Examiner—J. Carroll
Attorney, Agent, or Firm—Seidel, Gonda & Goldhammer

[57] ABSTRACT

A lead frame is provided which allows for the lengthening of leads caused by the bonding of the lead tips to a ceramic substrate, without causing the lead frame to deform in a vertical direction. The lead frame comprises a generally flat but relatively rigid outer frame portion. Lead support members integral with the outer frame portion support a plurality of integrally formed leads. The leads are attached at one end to a lead support member. The other end of each lead is free for bonding to the conductor pads of a substrate. The lead support members are constructed to yield and deform in the horizontal plane of the lead frame in a direction outward along the longitudinal axis of the leads to accommodate the flow of metal and thermal expansion of the leads due to bonding. Several embodiments are disclosed showing different possibilities for constructing the lead support members to yield in the plane of the frame. In one embodiment, the lead support member is an elongated bar attached at each end thereof to the outer frame. A notch at each attachment site reduces the area of the frame at that point, allowing space for the support member to bend outwardly under pressure from the leads. A diagonal crosspiece may be attached to prevent the support member from deforming vertically. In each corner of the frame leads project from support members which are attached at an acute angle to structure in a corner area of the support frame. In a second embodiment, the corner leads project from cup-shaped structures in corner areas of the frame.

7 Claims, 4 Drawing Figures

LEAD FRAME FOR SEMICONDUCTOR CHIP

BACKGROUND OF THE INVENTION

The manufacture of commercial semiconductor devices is today largely a high-speed semi automated or automated operation. This invention is related to a particular step in the manufacturing process, namely the bonding of the electrical conductor leads to a substrate in which the semiconductor chip will be supported. The leads are used to connect the chip to outside circuitry.

It is a common practice in the machine assembly of semiconductor chips to convey the leads into the machine on an integral lead frame. The lead frame is normally a thin strip of the conductor metal which has been die stamped into a pattern comprising leads and supporting structure. The leads project from supporting structure and are aligned along the supporting structure in a spaced relationship that will place the free ends of the leads in proper position to be bonded to the substrate. The frame normally has positioning guides, such as apertures along the support frame, to facilitate the free ends of the leads being placed in the proper position above the substrate by aligning the apertures over a pin or pins of the machine.

The lead frames run through the machine as a continuous ribbon of frames during the step where bonding to the substrate occurs, the bonding machine, including the positioning guides locate the free ends of the leads above conductor pads on the substrate. With both the substrate and the leads in position, the bonding tool presses the free ends of the leads against the conductor pads of the substrate and effects a permanent bond by known means such as thermocompression or ultrasonic bonding. The frame and attached substrate then proceed through the remaining steps of the assembly machine, including wire bonding of the semiconductor chip on the substrate to the leads. One of the final steps in the process is a cutting step wherein the leads are cut free of the frame near the point where they are attached to the supporting structure. The leads are also bent to a proper angle, normally vertically downward at a point just outboard of the ceramic carrier.

It is important in the assembly process to maintain tolerances in the lead frame ribbon which will prevent a frame from becoming hung up in the machine at any stage. This invention is in particular concerned with maintaining the frame in a generally flat plane after the leads are bonded to a substrate such as a ceramic carrier and until the leads are cut away from the frame. The bonding process causes metal flow along the leads in a direction away from the bonding site. There may also be some thermal expansion along the lead from thermo compression bonding. Both of these phenomena will tend to increase the length of the lead. If uncompensated, this may result in the outer edges of the lead frame curling inward and vertically, (to the plane of the frame) in a shape similar to a potato chip. Moreover, the leads may themselves bend in a vertical curvature. Both of these results present problems for the processing machine.

It would be ideal to maintain the lead frame in a perfectly flat horizontal plane to keep close tolerances and proper positioning while passing through the machine. Thus, any device whereby the lengthening of the leads caused by bonding does not cause a curling or vertical deformation of the leads and lead frame is advantageous. This invention is related to such a device.

SUMMARY OF THE INVENTION

A lead frame is provided which allows for the lengthening of leads caused by the bonding of the lead tips to a substrate, without causing the lead frame to deform in a vertical direction. The lead frame comprises a generally flat but relatively rigid outer frame portion. Lead support members joined to the outer frame portion support a plurality of integrally formed leads. Each lead is attached at one end to a lead support member. The other end of each lead is free for bonding to a conductor pad of a substrate. The lead support members are constructed to yield and deform in the plane of the lead frame in a direction outward along the longitudinal axis of the leads to accommodate the flow of metal and thermal expansion of the leads due to bonding.

Several embodiments are disclosed showing different constructions to allow the lead support members to yield in the plane of the frame. In one embodiment, a lead support member is an elongated bar attached at each end thereof to the outer frame. A notch at each end reduces the area of the frame at that point, allowing space for the support member to bend outwardly under pressure from the leads. A diagonal crosspiece may be attached to prevent the support member from deforming vertically. In each corner of the frame, leads project from support members which are attached at an acute angle to structure in a corner area of the support frame. In a second embodiment, the corner leads project from cup-shaped structures in corner areas of the frame.

Figure 1:
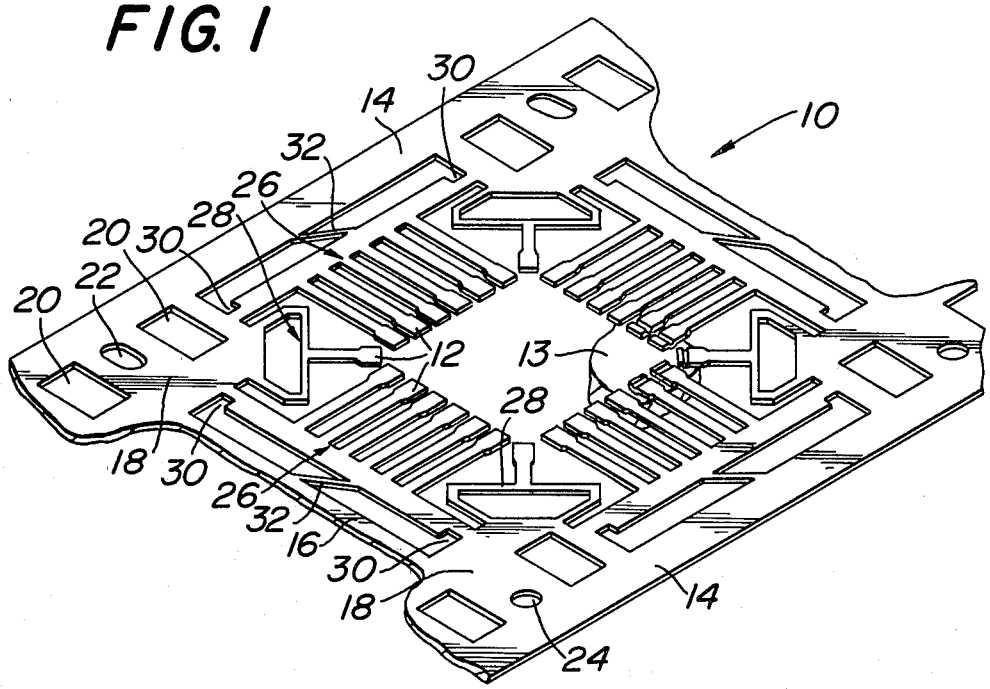
FIG. 1 is a perspective view of a portion of a lead frame according to the present invention showing one complete set of leads and surrounding structure.

For the purpose of illustrating the invention, there is shown in the drawings a form which is presently preferred; it being understood, however, that this invention is not limited to the precise arrangements and instrumentalities shown.

DETAILED DESCRIPTION OF THE DRAWINGS

Referring now to the drawings wherein like numerals indicate like elements, there is shown in FIG. 1 an embodiment of a lead frame 10 according to the present invention. Lead frame 10 may be integrally formed by die stamping a pattern from a thin strip of conducting material such as Kovar (trademark). The purpose of frame 10 is to support electrical conductor leads 12 in a spaced relationship wherein the tips of leads 12 may be bonded to a substrate (e.g.—a ceramic substrate) which will support a semiconductor chip. A portion of ceramic substrate 13 is shown in FIG. 1. The substrate 13 has conductor pads formed on its surface to which the tips of the leads 12 are bonded. The bonding may be accomplished by thermocompression or ultrasonic means. Both processes are well known in the bonding art.

The pattern of lead frame 10 shown in FIG. 1 includes a relatively wide edge-strip 14 at each lateral edge. Edge-strips 14 provide necessary rigidity to the frame. Transverse strips 16 interconnect between edge-strips 14, defining between them a single panel of the frame 10. Each panel contains the necessary leads 12 for one semiconductor device.

Also included in the pattern of lead frame 10 are corner areas 18, which are generally reinforced areas at the corner of each panel where a transverse strip 16 intersects an edge-strip 14. Rectangular cut-outs 20 are stamped in corner area 18 to reduce the weight and material of the lead frames. Also provided are circular apertures 24, and oval apertures 22. Aperatures 22, 24 are used in conjunction with positioning guides on a processing machine (not shown) to position a panel of lead frame 10 so that the leads are above and aligned with the conductor pads on the ceramic substrate.

As explained in the background of the invention, when leads 12 are bonded to the substrate, the bonding process will cause a back-flow of metal and possible thermal expansion along the leads 12, which must be compensated for without causing vertical deformation of the frame 10 or leads. This is accomplished by providing lead support members 26 and 28. Leads 12 are attached at one end to one of support members 26 or 28. The support members 26 and 28 are so constructed that they will yield and deform outward in the horizontal plane of the lead frame 10 under the force along the lead axis caused by bonding. In understanding how support members 26, 28 are constructed to allow this deformation in a horizontal plane, it is helpful to consider that edge strips 14, transverse strips 16 and corner areas 18 comprise what may be termed a relatively rigid outer frame. This outer frame provides the necessary rigidity to frame 10. The support members 26, 28 are attached to the outer frame in such manner that the geometry of the attachment allows for yielding outward in a horizontal plane.

Figure 2:
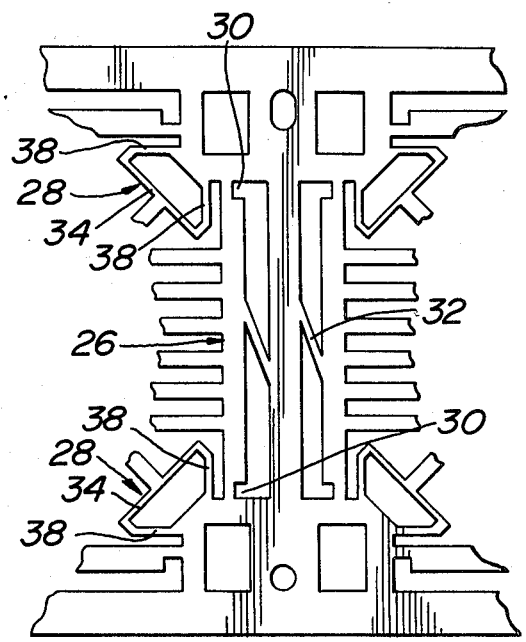
FIG. 2 is a top view of a portion of a lead frame according to the present invention.

Referring now to FIG. 2, on the outside edge of lead support member 26 a notch 30 is cut out adjacent to the point of attachment of member 26 to each corner area 18. The reduced dimensions of support member 26 at a notch 30 allows bending of support member 26 to occur in a direction outward and in the general direction of the longitudinal axis of the leads 12 attached to the particular member. A thin diagonal strip 32 is attached between the outer frame and member 26 to keep member 26 from deforming in a vertical direction.

Support member 28 supports a corner lead to the chip. Support member 28 is an elongated strip joined at the ends to meet at an acute angle to strips 38, which are in turn attached to corner areas 18. This allows lead support member 28 to deform outward toward corner area 18 under force along the axis of the lead 12. Room to accommodate bending outward of member 28 is provided by the angle of attachment to strips 38, so no notches are necessary.

Figure 3:
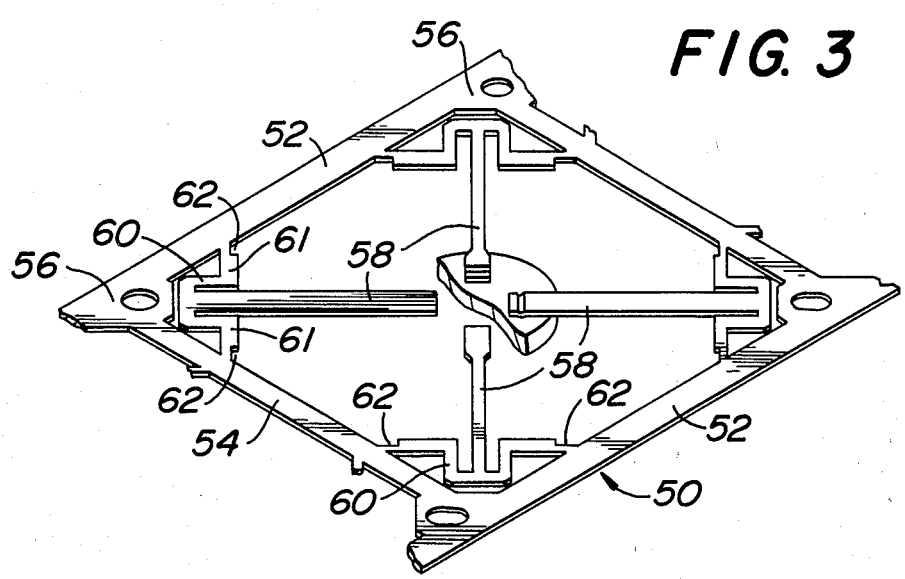
FIG. 3 is a perspective view of a second embodiment of a lead frame according to the present invention showing one set of leads and surrounding structure.
Figure 4:
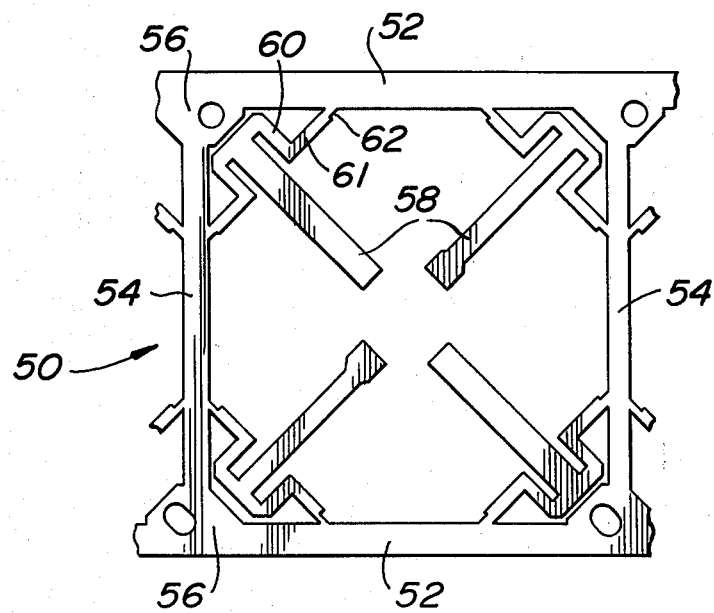
FIG. 4 is a top view of the embodiment shown in FIG. 3.

A second embodiment of a lead frame 50 is shown in FIGS. 3 and 4. Lead frame 50 is a type which may be used more frequently with bi-polar semiconductor devices requiring a lesser number of external leads. Frame 50 comprises edge strips 52, transverse strips 54 and corner areas 56. A lead 58 projects inward from each of the four corners defined by edge strips 52 and transverse strips 54. The leads 58 depend at one end from lead support structures 60. Support structure 60 is generally cup-shaped to provide longer leads, with the edge flanges 61 of the cups attaching to strips 52 and 54. Notches 62 are stamped in the outside edge of support member 60 adjacent to strips 52 and 54. The notches 62 reduce the area of the metal so that deformation may occur outward along the axis of the attached lead 58 when bonding occurs.

The present invention may be embodied in other specific forms without departing from the spirit or essential attributes thereof and, accordingly, reference should be made to the appended claims, rather than to the foregoing specification, as indicating the scope of the invention.

I claim:

1. A lead frame of the type wherein electrical conductor leads are integrally formed with the frame in a spaced-apart relationship in the plane of the frame in order that the leads may be positioned and aligned for bonding the lead tips to a substrate, comprising:
   (a) a relatively rigid outer frame;
   (b) a plurality of elongated electrical conductor leads, each supported at one end within the lead frame and having a free end for bonding to a substrate;
   (c) a plurality of lead support members integral with the outer frame and the leads, the support members being spaced apart from and within the boundaries of the outer frame and having ends attached to the outer frame, each lead being integrally joined at one end to a support member and extending inwardly from the support member, the support members having reduced physical dimensions where they are attached to the outer frame so that the support members will deform outwardly in the plane of the frame to accommodate outward expansion of the leads during bonding without causing the leads, the support members or the outer frame to deform in a direction outside the plane of the frame.

2. A lead frame as in claim 1 wherein support members are elongated bars attached at each end to the outer frame, and the leads extend substantially perpendicular to the major axis of the support members.

3. A lead frame as in claim 1 further comprising support members having a notch where they are joined to the outer frame on the edge of the support member adjacent the outer frame, the notch providing space for bending of the support member toward the outer frame thereby rendering the support member deformable in an outward direction in the plane of the frame.

4. A lead frame as in claim 2 further comprising support members having a notch at each end on the edge of the support member adjacent the outer frame, the notch providing space for bending of the support member toward the outer frame thereby rendering the support member deformable in an outward direction in the plane of the frame.

5. A lead frame as in claim 2 further comprising at least one relatively thin diagonal strip disposed between the support member and the outer frame and attached at one end to the support member and at the other end to the outer frame to oppose deformation of the support member in a direction outside the plane of the frame.

6. A lead frame as in any one of claims 2, 4, or 5 further comprising leads projecting inwardly from support members attached at an acute angle to corner areas of the outer frame whereby the angular attachment provides space for support members to bend outwardly in the plane of the frame.

7. A lead frame of the type wherein electrical conductor leads are integrally formed with the frame in a spaced-apart relationship in the plane of the frame in order that the leads may be positioned and aligned for bonding the lead tips to a substrate, comprising:
(a) a relatively rigid rectangular outer frame;
(b) a plurality of lead support members in the form of elongated bars spaced apart from and located within the outer frame and parallel to a side of the frame, each support member being joined at its ends to a side of the outer frame;
(c) a plurality of elongated electrically conductive leads, each lead supported at one end by a support member and extending inwardly from the support member and having a free end for bonding directly to a substrate on which may be mounted at least one semiconductor device, each of the support members having a notch at each end on the outward-facing edge of the member adjacent the outer frame, the notch providing space for deformation of the support member toward the outer frame, so that the support members will deform outwardly in the plane of the frame to accommodate outward expansion of the leads during bonding without causing the leads, the support members or the outer frame to deform in a direction outside the plane of the frame.

* * * * *